United States Patent [19]
Spriggs et al.

[11] Patent Number: 6,088,288
[45] Date of Patent: Jul. 11, 2000

[54] MEMORY DEVICE AND METHOD OF REDUCING GROUND BOUNCE IN A MEMORY DEVICE

[75] Inventors: Stephen W. Spriggs, Rowlett; Bryan D. Sheffield, Allen, both of Tex.

[73] Assignee: Texas Instruments Incorporated, Dallas, Tex.

[21] Appl. No.: 09/405,480

[22] Filed: Sep. 24, 1999

Related U.S. Application Data

[60] Provisional application No. 60/101,885, Sep. 25, 1998.

[51] Int. Cl.[7] ................................. G11C 8/00; G11C 7/00
[52] U.S. Cl. ..................... 365/230.06; 365/194; 365/226
[58] Field of Search ............................... 365/230.06, 194, 365/226

[56] References Cited

U.S. PATENT DOCUMENTS

| | | | |
|---|---|---|---|
| 5,287,527 | 2/1994 | Delp et al. | 365/230.06 |
| 5,719,818 | 2/1998 | Tovim et al. | 365/230.06 |
| 5,774,411 | 6/1998 | Hsieh et al. | 365/230.06 |

*Primary Examiner*—Trong Phan
*Attorney, Agent, or Firm*—J. Dennis Moore; Wade James Brady, III; Richard L. Donaldson

[57] ABSTRACT

A method of reducing power supply current transients in a memory array caused by a simultaneous change in logic state of numerous CMOS digital circuits during a memory write cycle. Write driver enable signals (ENT, ENC) and bitcell enable signals (WBC1–WBC24) are sequentially delayed in time during the write cycle through use of the propagation delay of inverters (INV1–INV24-7). The sequential time delay reduces the number of circuits that are simultaneously changing logic state at any given time during the write cycle. The power supply current transient is transformed from a single, large change in current to a series of smaller changes displaced in time from each other during the write cycle. The ground bounce of the power supply network attributed to the current transient is significantly reduced, such change in ground potential being directly related to the magnitude of the current transient and its rate of change with respect to time.

13 Claims, 4 Drawing Sheets

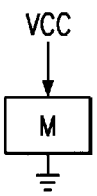
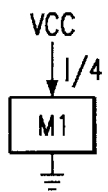
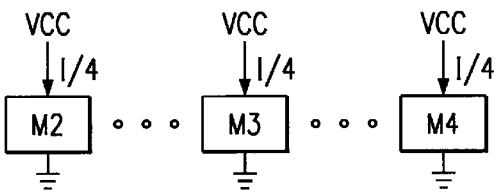
FIG. 1a
FIG. 1b
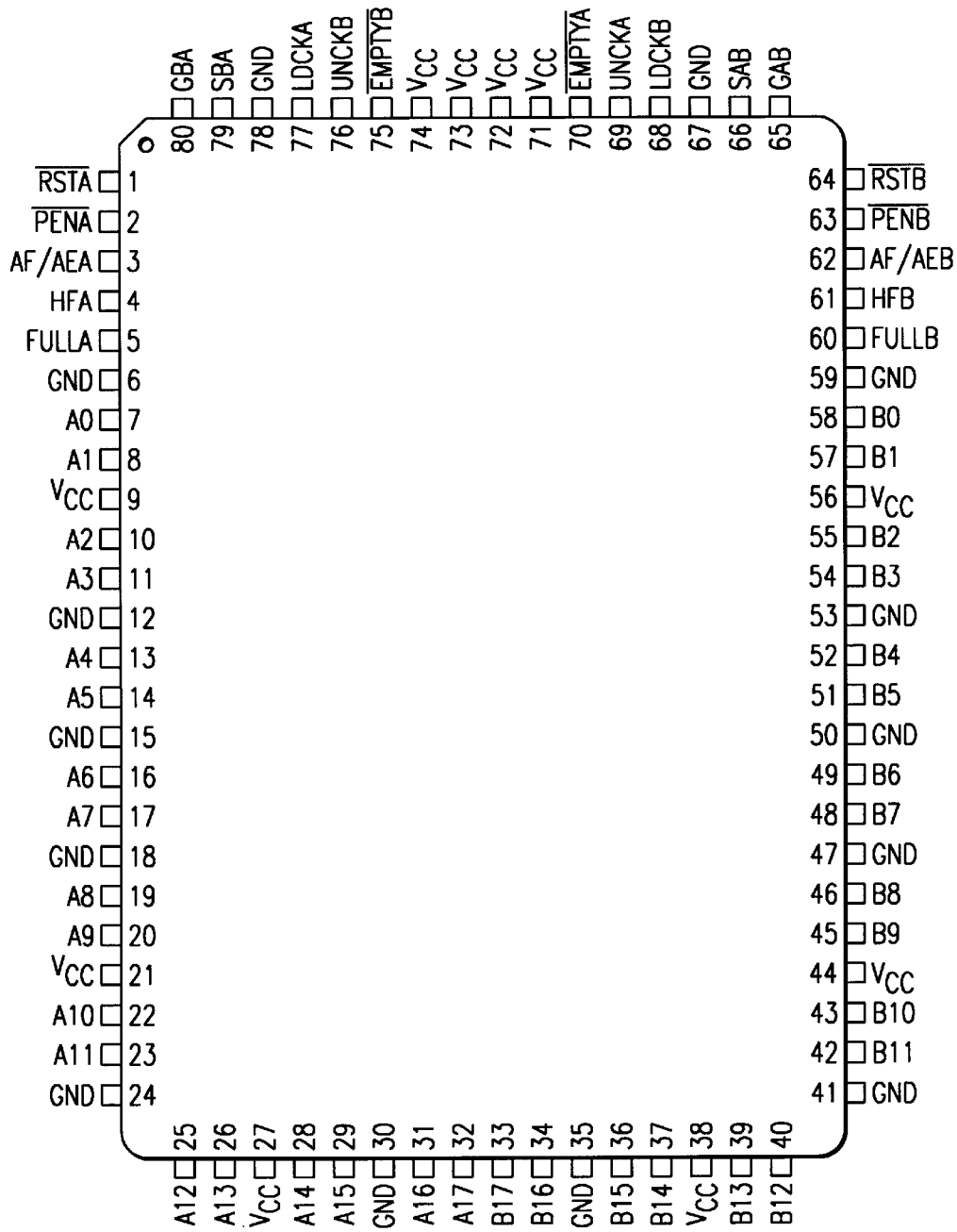
FIG. 2

MEMORY DEVICE AND METHOD OF REDUCING GROUND BOUNCE IN A MEMORY DEVICE

This application claims priority under 35 USC § 119(e)(1) of provisional application No. 60/101,885, filed Sep. 25, 1998.

FIELD OF THE INVENTION

The invention relates to reducing the noise in the power supply network of a memory array and, in the preferred embodiment, to reducing transient current spikes in the ground circuit of the power supply network, as implemented in a complementary metal oxide on silicon (CMOS) semiconductor device.

BACKGROUND OF THE INVENTION

Memory arrays are comprised of individual bitcells whose outputs are used to electrically represent logical 1's and 0's. The bitcells are typically made up of CMOS transistor circuits whose outputs can be made to be at some specific voltage value which corresponds to a logical 1 or 0. Memory arrays also include write driver circuits which provide the input signals to the bitcells in order to store the output required for a logical 1 or 0.

CMOS transistors are known to conduct only negligible leakage current when in a non biased steady-state or non-transient condition of operation, but can cause substantial current flow from a power supply under transient switching conditions when used in complementary pairs. The bitcells and write drivers in a memory array utilize CMOS transistors in complementary pairs to achieve the two output voltage levels that correspond to a logical 1 or 0.

The write driver circuits of the memory array provide an input signal to numerous bitcells simultaneously during a memory write cycle. This causes substantial current flow through the power supply network due to the simultaneous switching, or transient condition, of both the write drivers and the bitcells. This transient current flow or current spike in the power supply network results in a transient voltage being induced in the various circuit paths which is proportional to the inductance of the circuit path and the rate of change of the transient current with respect to time or, $V=L*(di/dt)$. This transient voltage typically appears on the power supply return paths and is commonly referred to as "ground bounce."

It is possible for the transient voltage in the power supply network to be of such a magnitude that circuits attached to the network may change logic state in reaction to this voltage, resulting in a functional failure of the electronic system. The current spike must therefore be eliminated or reduced to an acceptable level in order for the electronic system to function as required.

SUMMARY OF THE INVENTION

The invention will be disclosed in the context of its usage in a memory array included in a Texas Instruments' application specific integrated circuit (ASIC).

The invention is comprised of inverter devices included in a memory array that sequentially delay in time application of write enable signals to the write driver circuits and bitcells of the array. This sequential time delay is the cumulative propagation delay of the inverter devices in that the externally supplied write enable signals are routed through the inverters before being applied to the write drivers and bitcells.

The time sequencing of the write enable signals allow only limited portions of the memory array to be active or switching at any given time during the memory write cycle. The result is a series of small current transients displaced in time from each other and much lower in magnitude than that which usually occurs in a memory array.

The detailed description of the preferred embodiment will show that the circuitry of the present invention provides the means to substantially reduce transient electrical currents and voltages caused by the simultaneous switching of CMOS semiconductor devices. This simultaneous switching is known to cause unacceptable transients on the power supply network of semiconductor devices and is commonly referred to as "ground bounce."

It will be further shown that the circuitry of the present invention is able to reduce the aforementioned transient parameters by causing time delays in the simultaneous switching of CMOS devices in a memory array during a memory write cycle. It will be seen that these time delays serve to both reduce the magnitude of the transient parameters and distribute them time-wise during the memory write cycle. This is accomplished within the timing constraints of the electronic system the memory array is included in.

The detailed description will also show that the aforementioned time delays are realized through the addition of CMOS inverter devices with some propagation time through these devices when changing output logic state in response to an input signal. No additional circuitry or discrete components are required to realize the necessary time delays.

It will be seen that the placement of the inverter devices in the memory array is not rigid in nature and is easily adaptable to memory arrays of almost any configuration and size. The placement of the inverter devices for a specific configuration of memory array can be readily determined in normal fashion by those skilled in the art during the design phase of a semiconductor device. The use of the inverter devices of the present invention is also adaptable to other memory array configurations through the selection of inverter devices with more or less propagation delay as would be needed for a specific application.

Further, the inclusion of the inverter devices in memory arrays as described herein will be shown to significantly reduce their complexity in comparison to that of the known art:

The number of write driver devices typically included in a memory array of the known art to reduce ground bounce will be less; and The power supply network within a memory array of the known art will be simplified and will require less external device pins for power and ground.

The detailed description will also show that the ground bounce of the memory array is reduced in a manner as described herein that eliminates the possibility of unacceptable transients being propagated to circuitry outside the array. This reduces the need for transient suppression in the surrounding circuitry of the electronic system the memory array is included in.

BRIEF DESCRIPTION OF THE VIEW OF THE DRAWINGS

FIGS. 1(a)–1(b) are block diagrams of a partial memory array;

FIG. 2 is a plan view of a packaged memory device;

FIGS. 3(a)–3(b) are pulse waveforms;

Common reference designators are used throughout the drawings, except where noted herein, and are replicated wherever necessary for clarity.

DETAILED DESCRIPTION OF THE PREFERRED EMBODIMENTS

Introduction

The problem of ground bounce is common to all high speed digital devices that perform simultaneous switching or logic state changes as a normal functional attribute of the electronic system in which they are included. A survey shows that the various techniques employed for reducing ground bounce in memory arrays are utilized in other types of devices as well. The discussion that follows will therefore include descriptions that are applicable to memory arrays in addition to other device types.

The transient current spike that causes ground bounce flows through conductors inside the device package which have inherent inductance that varies with lead length and switching frequency. Device package design is typically optimized to include conductors with minimal length and to locate Vcc and ground pins in such a fashion that the power supply network paths are as short as possible.

A common feature of the known art is the use of multiple Vcc and ground pins in memory device packaging. This reduces the transient current in any one part of the memory array by providing multiple parallel paths within the array for the power supply network. FIG. 1 is an example that illustrates the effect of using multiple power supply pins.

In FIG. 1($a$) the memory array M is supplied its current I through just one each Vcc and ground pin. If the memory array were to be segmented inside the device package and supplied by four Vcc and ground pins as shown in FIG. 1($b$), the transient current flowing in any one memory circuit path is reduced to I/4. This reduces the numerator in the n V=L*(di/dt) for a reduced transient voltage V in the various parts of the power supply network of the memory device. The use of multiple Vcc and ground pins also allows the placement of the array segments physically closer to the power supply network which reduces the path length and inductance.

FIG. 2 is an example of a memory device that incorporates the use of multiple Vcc and ground pins. This figure shows a package drawing for a memory device that includes two separate 512×18 bit FIFO memories. It can be seen in FIG. 2 that the device package includes ten (10) Vcc pins and fourteen (14) ground pins.

Figure 3A:
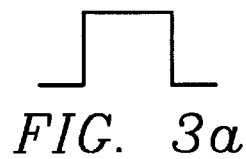
Figure 3B:
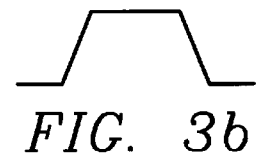

Another means used to reduce transients in memory devices, and other device types as well, is to increase the rise and fall times of various gating pulses used within the circuitry, commonly referred to as edge rate control. FIG. 3($a$) shows a pulse waveform with rise and fall times much less than those of FIG. 3($b$) as transitions are made between Vcc and ground. A gating pulse with the waveform of FIG. 3($a$) will cause a larger rate of change of transient current than one with the waveform of FIG. 3($b$). The effect of the waveform of FIG. 3($b$) will be to reduce the transient voltage by increasing the time during which current flow is changing as transistors are being turned on or off. This reduces the term (di/dt) in the equation for an induced voltage V=L*(di/dt).

It is also common practice to increase the number of write driver circuits which provide input signals to the bitcells, since it is during a memory write cycle that the transient current is greatest. A larger number of write drivers serves to distribute the transient current for the memory array into several parallel paths, with each carrying less transient current than would be the case with fewer drivers. This reduces the ground bounce in the same manner as adding Vcc and ground paths to the device by adding the appropriate package pins.

Figure 4:
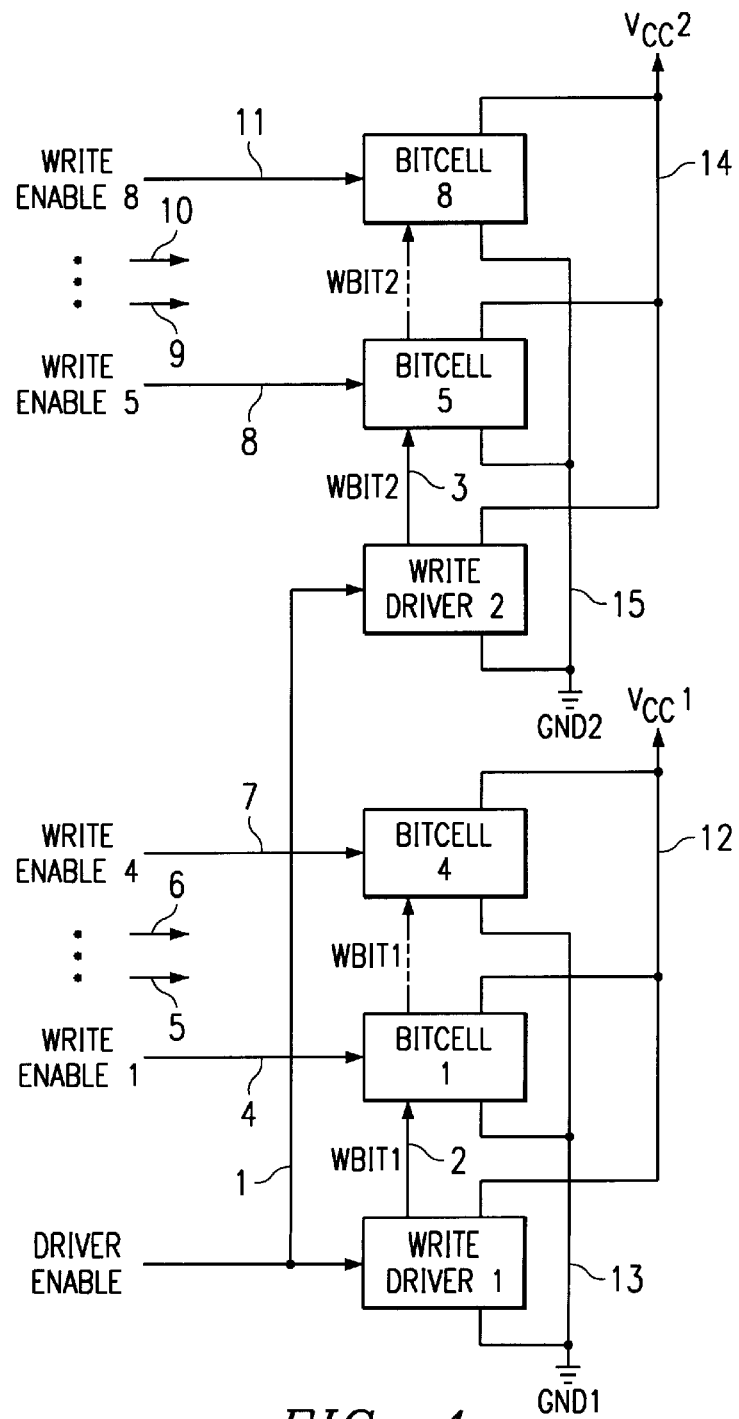
FIG. 4 is a block diagram of a partial memory array.

FIG. 4 is a partial functional block diagram of a memory array that illustrates the use of multiple write drivers and also multiple Vcc and ground paths. The partial memory array configuration in FIG. 4 includes two write driver circuits, WRITE DRIVERS 1 and 2, and eight bitcells BITCELL 1 through 8. The power supply network for the partial array includes Vcc1, Vcc2, GND1, and GND2. As stated previously, multiple write drivers and power supply network paths are utilized to reduce ground bounce by providing multiple current paths within the array to distribute the transient current caused by simultaneous switching of CMOS devices.

Referring to FIG. 4, when a data bit is to be written to system memory signal DRIVER ENABLE on signal line 1 is input to WRITE DRIVERS 1 and 2 which causes signals WBIT1 and WBIT2 to change logic state. Signals WBIT1 and WBIT2 are bussed to BITCELLS 1 through 4 and 5 through 8 on signal lines 2 and 3, respectively.

The specific bitcell(s) to be written to in FIG. 4 are selected by input signals WRITE ENABLE 1 through 8 on signal lines 4 through 11, respectively, which allow the data bit from the write drivers to be latched into the selected bitcell s). During this write operation simultaneous switching occurs within both the write driver and bitcell circuits, causing a transient current spike in the power supply network paths, Vcc1/GND1 and Vcc2/GND2, on signal lines 12 through 15, respectively. The use of two write drivers and two Vcc/ground paths serves to distribute the transient current and reduces its magnitude in a given part of the memory array.

The examples of the known art discussed here serve mostly to reduce transient effects and ground bounce within the memory device package only. It is possible in the known art for a transient voltage signal to be propagated outside the package and into the power supply network that other devices are attached to. This requires that the power supply network and other devices have adequate transient suppression to prevent the possibility of false triggering.

In the discussion of the preferred embodiment it will be shown that the circuitry of the present invention substantially reduces ground bounce within the memory package and eliminates the need for various transient reduction means found in the known art.

Preferred Embodiments

The detailed description of the preferred embodiment will have to do with the transient conditions that occur during the write cycle for a memory array. Only that circuitry associated with the writing of data into the memory array will be described; circuitry associated with the read cycle will not be described and is not shown in any of the figures.

Only one configuration of a memory array, with the included bitcells and write drivers, will be described in the discussion that follows. It should be noted that the effectiveness of the circuitry of the present invention is not limited to this configuration. The invention has application in any configuration of memory array and can be realized through the addition or deletion of similar circuit elements. It should be further noted that the circuitry of the present invention would be equally effective in applications other than memory arrays when used for the purpose of reducing ground bounce.

Figure 5:
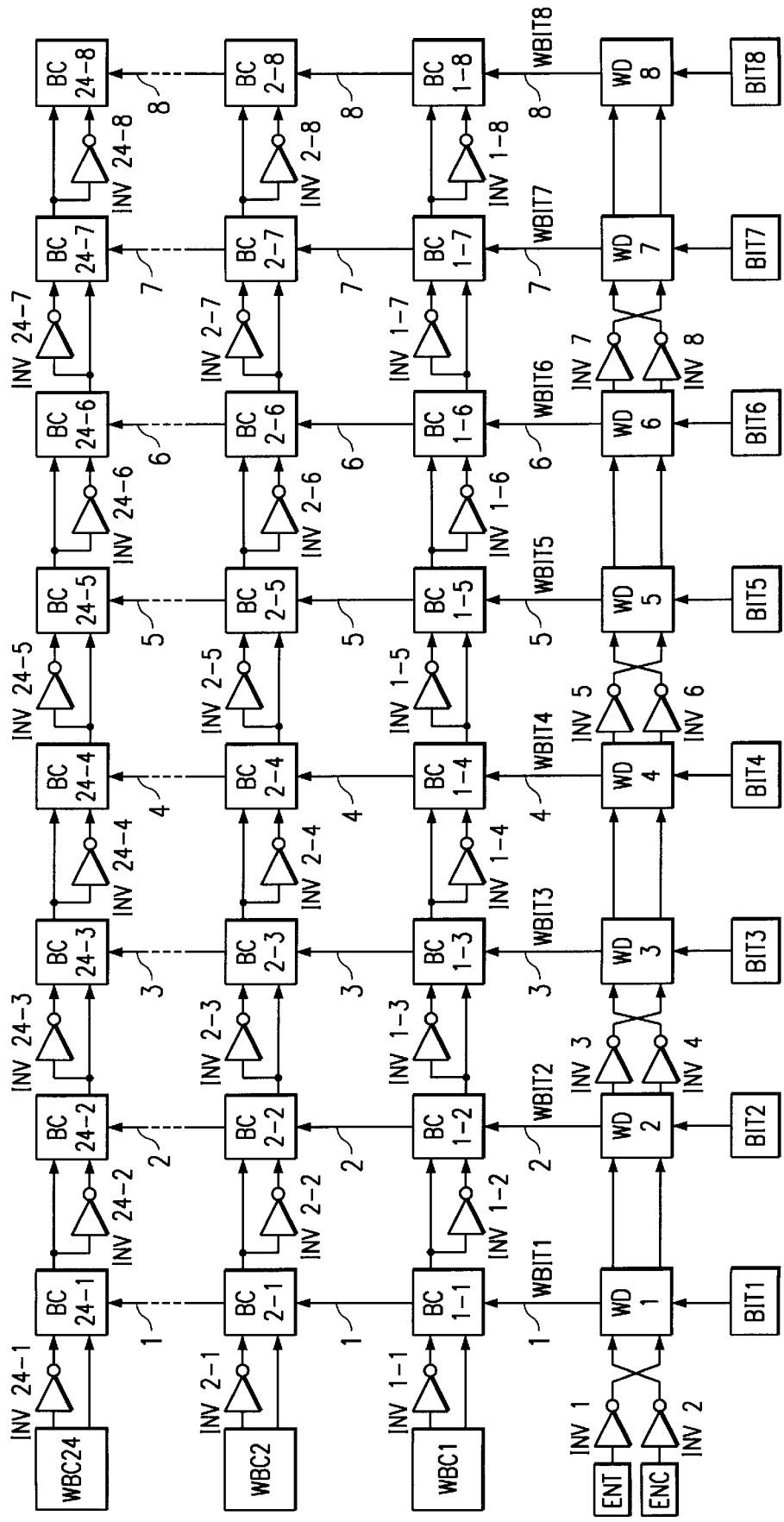
FIG. 5 is a block diagram of a 24×8 bit memory array.

FIG. 5 is a functional block diagram of a 24×8 bit memory array that includes the circuitry of the present invention. This memory array is included in a proprietary application specific integrated circuit (ASIC) of Texas Instruments.

FIG. 5 shows the memory array organized for clarity into twenty-four rows and eight columns of bitcells labeled BC 1-1 through BC 24-8, and one row of write drivers labeled WD 1 through WD 8. Bitcell rows 3 through 23 are not shown but are implied by the dotted lines between bitcell rows 2 and 24.

It should be noted here that the reference designators for the circuit elements, signal names, and signal lines in FIG. 5 are peculiar to this figure and are not common with other figures. This is done in order to provide an associative relationship within FIG. 5 for the purpose of clarity.

The circuitry of the present invention is included in FIG. 5 and is comprised of inverters INV 1 through INV 8 and INV 1-1 through INV 24-8.

Also shown in FIG. 5 are data bit input signals BIT1 through BIT8 as inputs to WD 1 through WD 8, respectively; write enable input signals ENT and ENC as inputs to INV 1 and INV 2, respectively; and write enable input signals WBC1 through WBC24 as inputs to bitcell rows 1 through 24, respectively. The write enable signals ENT, ENC, and WBC1 through WBC24 are bussed serially through each of the elements in the row to which they are applied, a distinction being that the signals pass through various inverters before being applied to the next element. All input signals to the memory array originate elsewhere in the electronic system in which the array is included and are controlled by the system CPU or memory controller.

FIG. 5 also includes signals WBIT1 through WBIT8 on signal lines 1 through 8, respectively, which are output from WD 1 through WD 8, respectively. Signals WBIT1 through WBIT8 are the data bits to be written to the various bitcells, and are bussed serially to the bitcells associated with a write driver. For example, WBIT1 from WD 1 is written to BC 1-1 through BC 24-1 on bussed signal line 1.

The detailed schematic diagrams for the bitcells and write drivers in FIG. 5 are not shown since they are not pertinent to an understanding of the invention. All bitcell circuits are identical to each other and all write driver circuits are likewise identical to each other, although these devices being similar in kind does not influence the effectiveness of the invention. Suffice it to say that these circuits are comprised of complementary CMOS devices that switch simultaneously when enabled, resulting in a transient current flow that causes ground bounce.

When a data bit is to be written to one or more bitcells signals ENT and ENC are placed in a true state by the system CPU or memory controller which enables WD 1 through WD 8 to provide output logic signals WBIT1 through WBIT8 on signal lines 1 through 8, respectively, which are bussed serially through the associated bitcells. The logic state of signals WBIT1 through WBIT8 are determined by input signals BIT1 through BIT8 to WD 1 through WD 8, respectively. Signals WBIT1 through WBIT8 may be the same or the complement of signals BIT1 through BIT8, depending upon the circuitry of the write drivers.

Concurrent with input signals ENT and ENC being placed in a true state one or more of the input signals WBC1 through WBC8 will also be placed in a true state to select the row or rows of bitcells to be written to. Data bits WBIT1 through WBIT8 are then latched into the bitcells of the selected rows and appear as output logic levels to the read circuitry of the memory array. As mentioned previously, the read circuitry of the memory array is not shown.

Summarizing, one or more rows of bitcells may be selected to be written to during a memory write cycle. Each bitcell in a given row is selected via bussed signal lines by one write enable signal applied to that row. All write drivers are likewise enabled via bussed signal lines that carry signals ENT and ENC. The data bit from a given write driver is written to each bitcell associated with that write driver also via a bussed signal line. All write enable signals and data bits input to the memory array are controlled by the system CPU or memory controller, and are provided coincident with some timing aspect of the system clock signal.

It can be seen from the preceding discussion that substantial simultaneous switching could occur when the various write enable and data bit signals are applied to the memory array of FIG. 5, causing unacceptable ground bounce were it not for the inclusion of the circuitry of the present invention. This circuitry serves to delay in time application of the write enable signals throughout the memory array, replacing a large transient spike with smaller transient currents displaced in time from each other. This time displacement and smaller transients are achieved only by the propagation delay of inverters INV 1 through INV 8 and INV 1-1 through INV 24-8 and their placement in the memory array; no additional circuitry or discrete components are required.

Referring to FIG. 5, the inverter pairs INV 1/INV 2, INV 3/INV 4, INV 5/INV 6, and INV 7/INV 8 each provide an increment of time delay between the application of write enable signals to write driver pairs WD 1/WD 2, WD 3/WD 4, WD 5/WD 6, and WD 7/WD 8, respectively. This increment of time delay is the propagation time of the inverters between input and output when changing logic states. Delay of the write enable signals to the write drivers causes a comparable time delay between data bit signal pairs WBIT1/WBIT2, WBIT3/WBIT4, WBIT5/WBIT6, and WBIT7/WBIT8 that are input to the various bitcells.

Another increment of time delay is achieved through the use of inverters INV 1-1 through INV 24-8 to delay application of the write enable signals WBC1 through WBC24 to the various bitcells, as shown in FIG. 5.

The use of the propagation time delay just described will in effect segment the memory array of FIG. 5 into four time-delayed sections of simultaneous switching. This means that for the memory array of FIG. 5 only two write drivers and forty-eight bitcells will be switching at any given time during a memory write cycle. This is in comparison to the possibility of eight write drivers and one hundred ninety-two bitcells being allowed to switch simultaneously were it not for the circuitry of the present invention. The transient current is therefore substantially less than would otherwise be the case since fewer devices are changing logic state at any given time during the write cycle.

Figure 6:
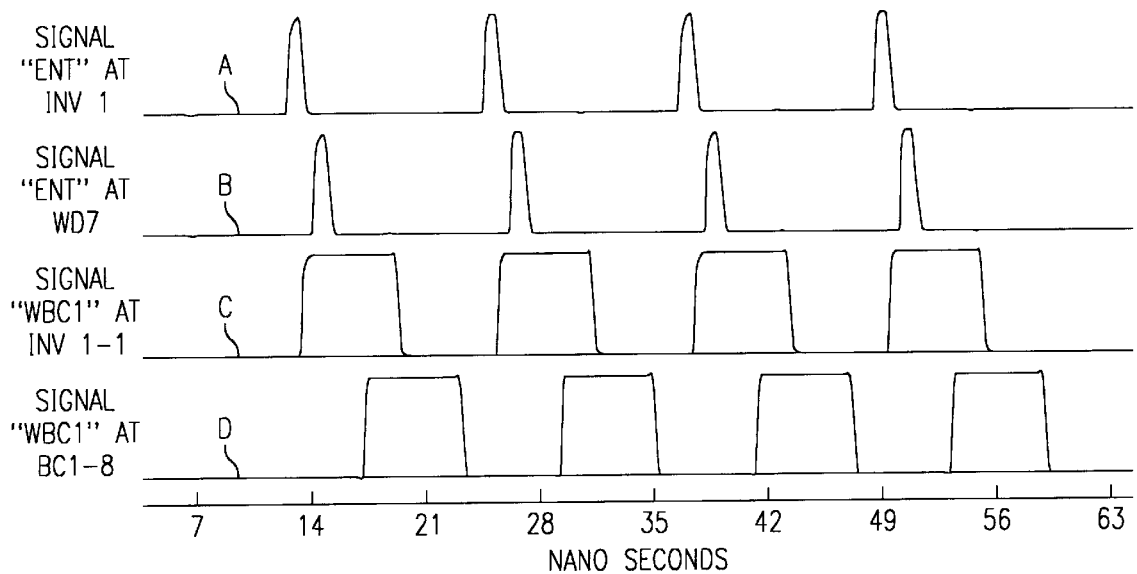
FIG. 6 is a timing diagram for part of a memory write cycle.

FIG. 6 is a partial timing diagram for a memory write cycle for the memory array of FIG. 5 and includes various write enable signals. The waveforms of FIG. 6 illustrate the write enable time delays that are realized through inclusion of INV 1 through INV 8 and INV 1-1 through INV 24-8 in the memory array of FIG. 5.

Waveform (A) of FIG. 6 is signal ENT as applied to the input of INV 1 in FIG. 5; waveform (B) of FIG. 6 is delayed signal ENT as applied to the input of WD 7 in FIG. 5. The write enable signal to WD 7 is delayed by approximately two nanoseconds from that input to INV 1.

Waveform (C) of FIG. 6 is signal WBC1 as applied to the input of INV 1-1 in FIG. 5; waveform (D) of FIG. 6 is delayed signal WBC1 as applied to the input of BC 1-8 in FIG. 5. The write enable signal to BC 1-8 is delayed by approximately 4 nanoseconds from that input to INV 1-1. The same would be true for each of the remaining rows of bitcells.

Figure 7:
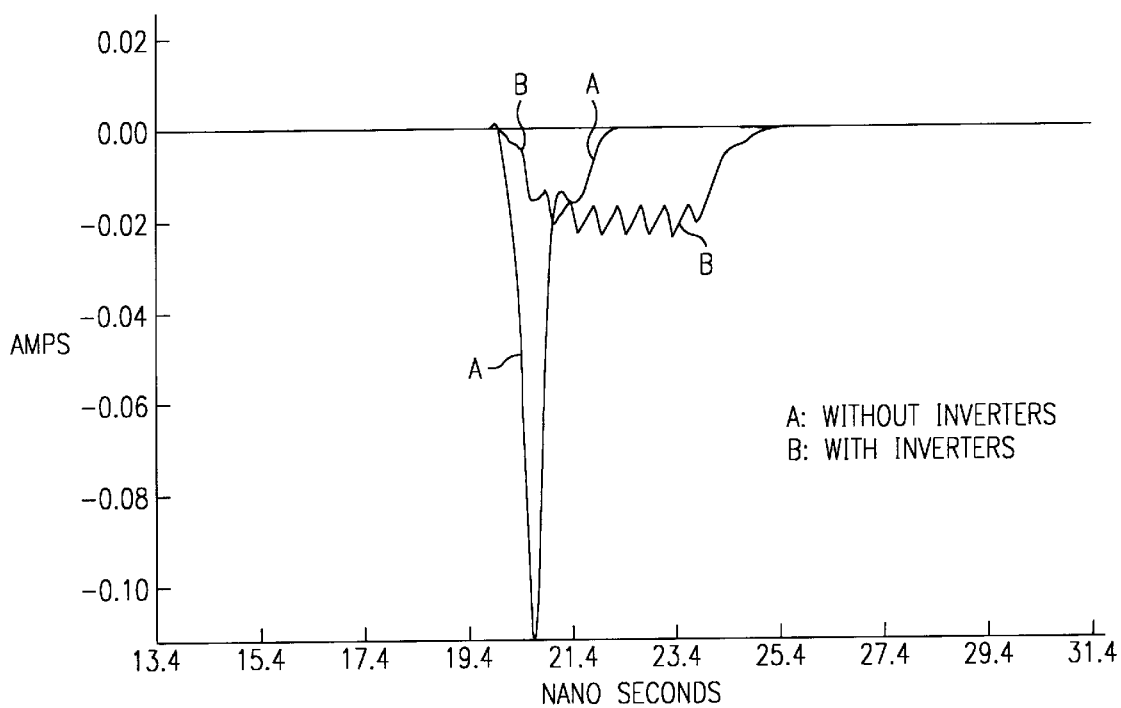
FIG. 7 is a timing diagram of transient current waveforms.

FIG. 7 is a plot of transient currents versus time for the memory array of FIG. 5. The waveforms of FIG. 7 illustrate the reduction in the transient current spike that is realized through inclusion of INV 1 through INV 8 and INV 1-1 through INV 24-8 in the memory array of FIG. 5.

Waveform (A) of FIG. 7 is the transient current spike on the power supply network of the memory array of FIG. 5 with no means of ground bounce reduction utilized; waveform (B) is the transient current that occurs when the circuitry of the present invention is included in the memory array of FIG. 5.

It can be seen from a comparison of waveforms (A) and (B) in FIG. 7 that the transient current is reduced from approximately 0.11 to 0.02 ampere due to the inclusion of inverters INV 1 through INV 8 and INV 1-1 through INV 24-8 in the memory array of FIG. 5.

As mentioned previously, the circuitry of the present invention has application in any configuration of memory array and is not limited to that shown in FIG. 5. This would be accomplished through the inclusion of inverters that provide a means of delaying the write enable signals to write drivers and bitcells as was described for the array of FIG. 5. The number and placement of these inverters would be determined by the number of write drivers and bitcells in a memory array and the amount of delay required between write enable signals to reduce the ground bounce to an acceptable level. It is also possible to select inverters with more or less propagation delay for additional design flexibility.

Also as mentioned previously, inclusion of the circuitry of the present invention in a memory array will reduce the number of Vcc and ground pins required in the device package.

Further, the number of write driver devices required is reduced over that typically used in the known art for distributing the transient current caused by the simultaneous switching of numerous CMOS devices. A reasonable estimate is that a memory array of the known art comparable in size would require 2–3 times as many write drivers as does that of FIG. 5. The circuitry of the present invention therefore serves to reduce the overall complexity of the memory array and its power supply network.

The circuitry of the present invention also serves to avoid the possibility of propagating an unacceptable transient to outside the memory array by in effect eliminating such transient. This is evident when comparing the transient current waveforms of FIG. 7.

We claim:

1. A CMOS memory device with reduced ground bounce comprising:

A. bitcells arranged in an array of rows and columns with one bitcell at the intersection of each row and column;

B. column write enable signal terminals receiving column write enable signals;

C. a write driver circuit for each column of bitcells, the write driver circuits being connected in series to the column write enable signal terminals, and each write driver circuit driving one column of bitcells in response to receiving the column write enable signals;

D. column delay circuits connected in series with the write driver circuits connection to the column write enable signal terminals selectively delaying the applying the column write enable signals to the write driver circuits;

E. row enable signal terminals receiving a row write enable signal for each row of bitcells;

F. a series connection of the bitcells in each row to one row enable signal terminal to apply the row write enable signal to all of the bitcells in that row; and G. row delay circuits connected in series with the bitcells in that row selectively delaying the applying the row write enable signals along the serial connection to the bitcells.

2. The device of claim 1 in which the column delay circuits include inverter circuits providing a delay.

3. The device of claim 1 in which the column delay circuits include inverter circuits providing a delay at alternating write driver circuits.

4. The device of claim 1 in which the row delay circuits include inverter circuits providing a delay.

5. The device of claim 1 in which the row delay circuits include inverter circuits providing a delay at every bitcell.

6. A method of reducing ground bounce in a CMOS memory device, the device having bitcells arranged in an array of rows and columns with one bitcell at the intersection of each row and column, the method comprising:

A. receiving column write enable signals for write driver circuits that each drive one column of bitcells;

B. receiving a row write enable signal for each row of bitcells;

C. applying the column write enable signals to all of the write driver circuits in series by selectively delaying the applying the column write enable signals along the serial connection to the write driver circuits; and D. applying the row write enable signals to all of the bitcells in each row in series by selectively delaying the applying the row write enable signals along the serial connection to the bitcells.

7. The method of claim 6 in which the selectively delaying the applying the column write enable signals along the serial connection to the write driver circuits includes delaying the applying to selected write driver circuits.

8. The method of claim 6 in which the selectively delaying the applying the column write enable signals along the serial connection to the write driver circuits includes delaying with column delay inverter circuits connected to the write driver circuits.

9. The method of claim 6 in which the selectively delaying the applying the column write enable signals along the serial connection to the write driver circuits includes delaying at alternating write driver circuits.

10. The method of claim 6 in which the selectively delaying the applying the row write enable signals along the serial connection to the bitcells includes delaying the applying to selected bitcells.

11. The method of claim 6 in which the selectively delaying the applying the row write enable signals along the serial connection to the bitcells includes delaying with row delay inverter circuits connected to the bitcells.

12. The method of claim 6 in which the selectively delaying the applying the row write enable signals along the serial connection to the bitcells includes delaying at all of the bitcells.

13. A method of reducing ground bounce in a CMOS memory device, the device having bitcells arranged in an array of rows and columns with one bitcell at the intersection of each row and column, the method comprising:

receiving column write enable signals for write driver circuits that each drive one column of bitcells;

receiving a row write enable signal for each row of bitcells;

applying the column write enable signals to all of the write driver circuits in series by selectively delaying the applying of the column write enable signals along the serial connection to the write driver circuits.

* * * * *